United States Patent
Standing et al.

(10) Patent No.: US 10,257,937 B2
(45) Date of Patent: Apr. 9, 2019

(54) DEVICE FOR ELECTRICALLY COUPLING A PLURALITY OF SEMICONDUCTOR DEVICE LAYERS BY A COMMON CONDUCTIVE LAYER

(71) Applicant: Infineon Technologies Austria AG, Villach (AT)

(72) Inventors: Martin Standing, Villach (AT); Andrew Roberts, Denbigh (GB)

(73) Assignee: Infineon Technologies Austria AG, Villach (AT)

(*) Notice: Subject to any disclaimer, the term of this patent is extended or adjusted under 35 U.S.C. 154(b) by 350 days.

(21) Appl. No.: 14/324,316

(22) Filed: Jul. 7, 2014

(65) Prior Publication Data

US 2016/0007470 A1    Jan. 7, 2016

(51) Int. Cl.
*H05K 1/18* (2006.01)
*H01L 21/288* (2006.01)
(Continued)

(52) U.S. Cl.
CPC ........... *H05K 1/186* (2013.01); *H01L 21/288* (2013.01); *H01L 21/76802* (2013.01); *H01L 21/76898* (2013.01); *H01L 23/13* (2013.01); *H01L 23/481* (2013.01); *H01L 23/49833* (2013.01); *H01L 23/5384* (2013.01); *H01L 23/5389* (2013.01); *H01L 24/24* (2013.01); *H01L 24/25* (2013.01); *H01L 24/32* (2013.01); *H01L 24/82* (2013.01); *H01L 24/97* (2013.01); *H01L 25/0657* (2013.01); *H01L 25/16* (2013.01); *H01L 25/50* (2013.01); *H05K 1/141* (2013.01); *H05K 13/04* (2013.01); *H01L 2224/04105* (2013.01); *H01L 2224/06181* (2013.01); *H01L 2224/24137* (2013.01); *H01L 2224/2518* (2013.01);

(Continued)

(58) Field of Classification Search
CPC ................ H01L 23/13; H01L 23/4985; H01L 21/565–21/568; H01L 23/049; H01L 21/561; H01L 23/481; H01L 23/3128
USPC ................ 361/760–774, 790, 795; 257/686, 257/723–730
See application file for complete search history.

(56) References Cited

U.S. PATENT DOCUMENTS 6,297,548 B1 * 10/2001 Moden .................... H01L 23/13
257/686
7,598,607 B2 * 10/2009 Chung ................ H01L 23/3128
257/686

(Continued)

FOREIGN PATENT DOCUMENTS

KR    20130133167 A    12/2013
KR    20140070618 A    6/2014

*Primary Examiner* — Tuan T Dinh
(74) *Attorney, Agent, or Firm* — Murphy, Bilak & Homiller, PLLC

(57) ABSTRACT

An assembly includes a first laminate electronic component and a second laminate electronic component. The first laminate electronic component includes a first dielectric layer, at least one first semiconductor die embedded in the first dielectric layer and at least one first contact pad including a first conductive via. The second laminate electronic component includes a second dielectric layer, at least one second semiconductor die embedded in the second dielectric layer and at least one second contact pad including a second conductive via. The first conductive via is electrically coupled to the second conductive via by a common conductive layer.

17 Claims, 12 Drawing Sheets

(51) Int. Cl.
*H01L 21/768* (2006.01)
*H01L 23/48* (2006.01)
*H01L 23/00* (2006.01)
*H01L 25/065* (2006.01)
*H01L 25/16* (2006.01)
*H01L 25/00* (2006.01)
*H05K 13/04* (2006.01)
*H05K 1/14* (2006.01)
*H01L 23/538* (2006.01)
*H01L 23/13* (2006.01)
*H01L 23/498* (2006.01)
*H05K 1/11* (2006.01)
*H05K 1/02* (2006.01)

(52) U.S. Cl.
CPC ............ *H01L 2224/32146* (2013.01); *H01L 2224/97* (2013.01); *H01L 2225/06541* (2013.01); *H01L 2924/1304* (2013.01); *H01L 2924/1305* (2013.01); *H01L 2924/13055* (2013.01); *H01L 2924/13091* (2013.01); *H01L 2924/1426* (2013.01); *H01L 2924/1427* (2013.01); *H01L 2924/1431* (2013.01); *H05K 1/0262* (2013.01); *H05K 1/113* (2013.01); *H05K 1/185* (2013.01); *H05K 2201/041* (2013.01); *H05K 2201/045* (2013.01); *H05K 2201/049* (2013.01); *H05K 2201/1003* (2013.01); *H05K 2201/10166* (2013.01)

(56) References Cited

U.S. PATENT DOCUMENTS

| | | | | |
|---|---|---|---|---|
| 7,800,916 B2* | 9/2010 | Blackwell | ............ | H01L 23/4985 361/760 |
| 7,843,700 B2* | 11/2010 | Fukuda | ................ | H01L 21/565 361/760 |
| 7,969,018 B2* | 6/2011 | Otremba | ............... | H01L 21/561 257/686 |
| 8,072,082 B2* | 12/2011 | Yean | ....................... | H01L 23/13 257/686 |
| 8,194,411 B2* | 6/2012 | Leung | .................... | H01L 24/82 361/761 |
| 2005/0168960 A1* | 8/2005 | Asahi | .................... | H01L 21/568 361/761 |
| 2006/0055050 A1* | 3/2006 | Numata | ........... | H01L 21/76898 257/774 |
| 2006/0120056 A1* | 6/2006 | Sasaki | ................... | H01L 21/568 361/735 |
| 2009/0039491 A1* | 2/2009 | Kim | ...................... | H01L 21/561 257/686 |
| 2010/0252937 A1* | 10/2010 | Uchiyama | ............ | H01L 21/486 257/777 |
| 2011/0175215 A1* | 7/2011 | Farooq | ................. | H01L 23/481 257/686 |
| 2013/0176013 A1 | 7/2013 | Takemae et al. | | |
| 2013/0221526 A1 | 8/2013 | Lange et al. | | |
| 2013/0286618 A1* | 10/2013 | Shibasaki | ............ | H01L 23/049 361/772 |

* cited by examiner

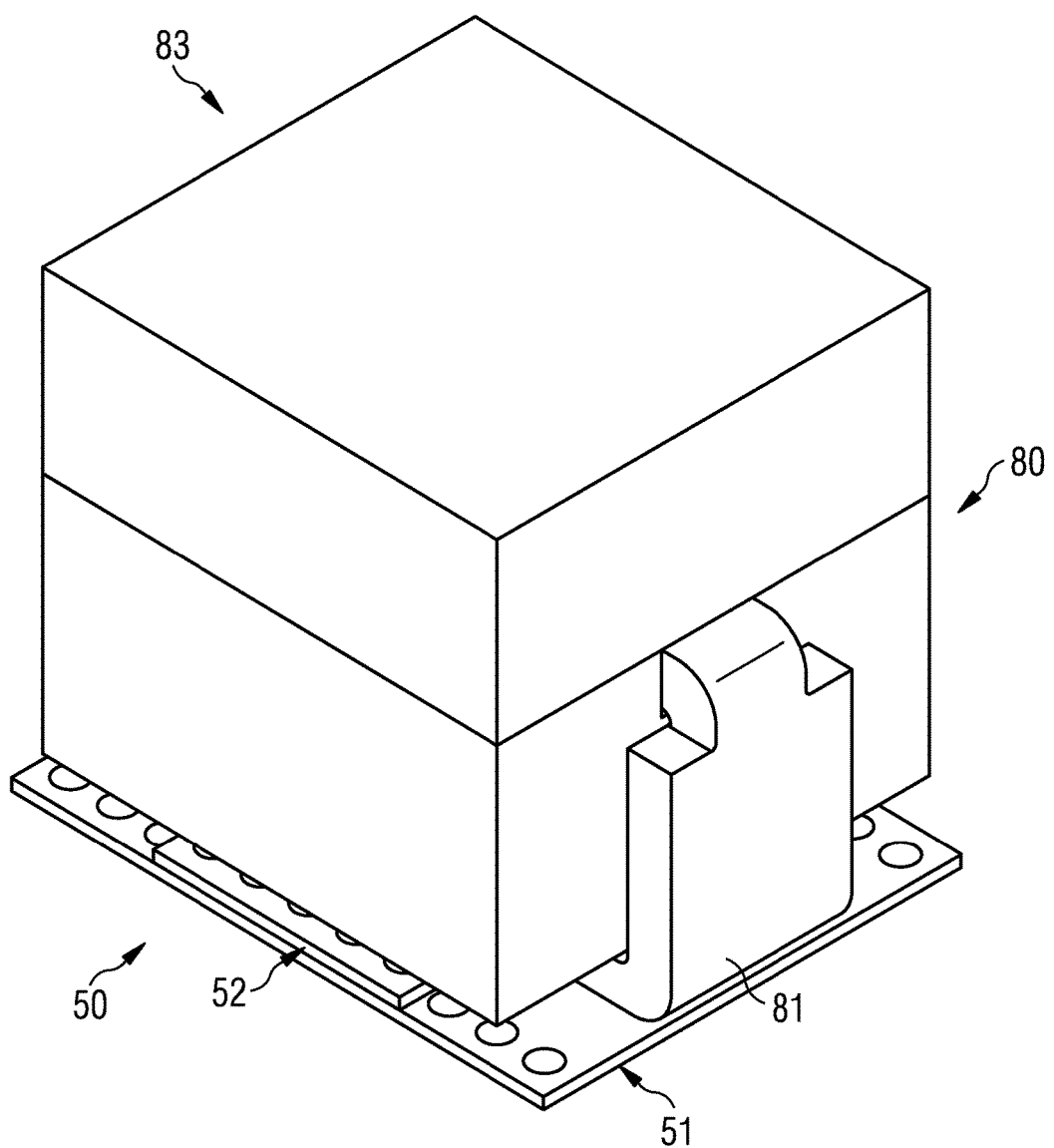

US 10,257,937 B2

DEVICE FOR ELECTRICALLY COUPLING A PLURALITY OF SEMICONDUCTOR DEVICE LAYERS BY A COMMON CONDUCTIVE LAYER

BACKGROUND

An electronic component may include one or more semiconductor devices in a package. The package may include internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections.

SUMMARY

In an embodiment, an assembly includes a first laminate electronic component and a second laminate electronic component. The first laminate electronic component includes a first dielectric layer, at least one first semiconductor die embedded in the first dielectric layer and at least one first contact pad including a first conductive via. The second laminate electronic component includes a second dielectric layer, at least one second semiconductor die embedded in the second dielectric layer and at least one second contact pad including a second conductive via. The first conductive via is electrically coupled to the second conductive via by a common conductive layer.

In an embodiment, a method includes mounting a second laminate electronic component including a second dielectric layer and at least one second semiconductor die embedded in the second dielectric layer on a first laminate electronic component including a first dielectric layer and at least one first semiconductor die embedded in the first dielectric layer. A contact pad of the second laminate electronic component is electrically coupled with a contact pad of the first laminate electronic component by introducing conductive material into at least one second via arranged in the contact pad of the second laminate electronic component and into at least one first via in the contact pad of the first laminate electronic component.

In an embodiment, an assembly includes at least one first semiconductor die embedded in a first dielectric layer including at least one first contact pad including a first conductive via, at least one second semiconductor die embedded in a second dielectric layer including at one second contact pad including a second conductive via and a means for electrically coupling the first conductive via to the second conductive via.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3b illustrates a perspective view of the assembly according to the second embodiment and an inductor.

DETAILED DESCRIPTION

Figure 1:
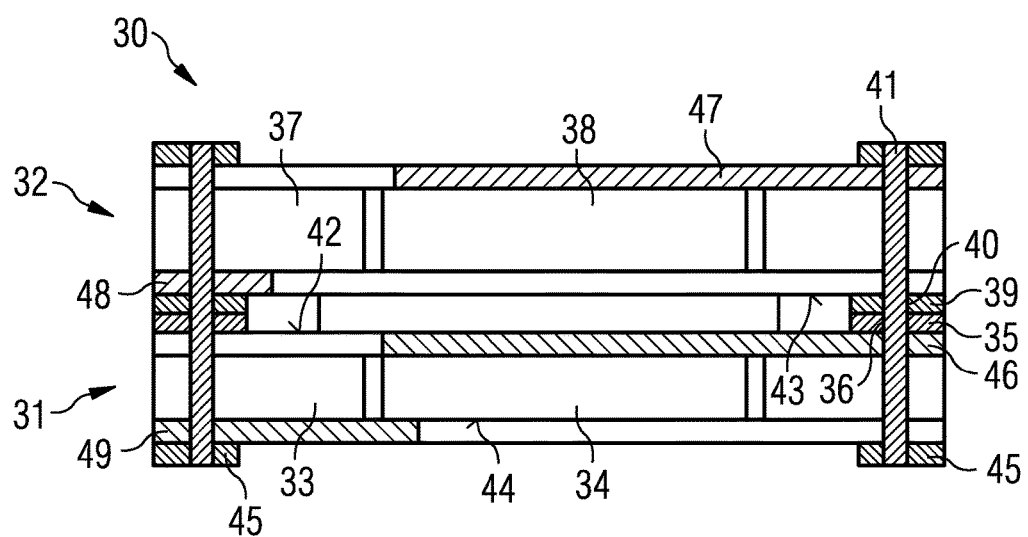
FIG. 1 illustrates an assembly according to a first embodiment.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, a "high-voltage device," such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device," such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

FIG. 1 illustrates an assembly 30 according to a first embodiment. The assembly 30 includes a first laminate electronic component 31 and a second laminate electronic component 32.

The first laminate electronic component 31 includes a first dielectric layer 33, at least one semiconductor die 34 embedded in the first dielectric layer 33 and at least one first contact pad 35 including a first via 36.

The second laminate electronic component 32 includes a second dielectric layer 37, at least one semiconductor die 38 embedded in the second dielectric layer 37 and at least one second contact pad 39 including a second via 40.

The second laminate electronic component 32 may be arranged on a first major surface 42 of the first laminate electronic component 31 in a stack to create the assembly 30.

The first contact pad 35 of the first laminate electronic component 31 is mounted on the second contact pad 39 of the second laminate component such that the first via 36 is vertically aligned with the second via 40. The first via 36 is electrically coupled to the second via 40 by a common conductive layer 41 which extends in both the first conductive via 36 and in the second conductive via 40. The conductive material forming the common conductive layer 41 may be introduced into the vias 36, 40 by various methods including electroless deposition, electroplating and physical insertion.

The contact pad 39 is arranged on the lower surface 43 of the second laminate electronic component 31 and the first contact pad 35 is arranged on the first major surface 42 of the first laminate electronic component 30 which is the upper surface of the first laminate electronic component 30.

The first via 36 may extend through the first contact pad 35 and through the thickness of the first dielectric layer 33. Similarly, the second via 40 may extend through the thickness of the second dielectric layer 37 and through the thickness of the second contact pad 39. The second contact pad 39 may be mounted directly on the first contact pad 35 such that the second via 40 is aligned with the first via 36 and such that the common conductive layer 41 extends through the first conductive via 36 and the second conductive via 40.

The common conductive layer 41 provides the electrical connection between the first contact pad 35 and the second contact pad 39 and provides an electrical connection between the first laminate electronic component 31 and the second laminate electronic component 32. The assembly 30 may include two or more such electrical connections, each including a via which extends through a contact pad of the first laminate electronic component 31 and a contact pad of the second laminate electronic component 32 and an electrically conductive layer which extends in the via in both contact pads and provides a common electrically conductive layer and a common electrical connection.

The first contact pad 35 and the second contact pad 39 may be in direct contact. In some embodiments, an electrically insulating layer, for example of electrically insulating adhesive, may be arranged between the first contact pad 35 and the second contact pad 39. The interface between the major surface of the first contact pad 35 and the major surface of the second contact pad may be free of solder.

The first via 36 may extend through the first contact pad 35 and through the thickness of the first dielectric layer 33 to an outer contact pad 45 arranged on the opposing major surface of the dielectric layer. In this embodiment, the common conductive layer 41 electrically couples the first contact pad 35 with the outer contact pad 45.

Similarly, the second via 40 may extend through the thickness of the second contact pad 39, through the thickness of the second dielectric layer 37 and through the thickness of a further contact pad arranged on the opposing major surface of the second dielectric layer 37. The common conductive layer 41 may electrically couple the second contact pad 39 with the further contact pad.

Since the first contact pad 35 of the first laminate electronic component 31 is electrically coupled to the second contact pad 39 of the second laminate electronic component 32 by the common conductive layer 41, the second laminate electronic component 32 may be attached to the first laminate electronic component 31 by an electrically insulating adhesive. The electrically insulating adhesive may be arranged in regions of the lower surface 43 of the second laminate electronic component 32 and between regions of the first major surface 42 of the first laminate electronic component 31 which are unoccupied by the contact pads 35, 39.

The first via 36 and the second via 40 may each include a substantially cylindrical through-hole. The common conductive layer 41 may be positioned on directly on side walls including a dielectric material or on one or more further metallic layers arranged on the side walls defining the through-hole.

The first laminate electronic component 31 includes an electrically conductive layer 46 arranged on the upper surface of the dielectric layer 33 which extend onto and is electrically coupled with the semiconductor die 34 and the first contact pad 35. An electrically conductive layer 49 is arranged on the lower surface 44 of the first laminate electronic component 31. The electrically conductive layers 46, 49 provide a lateral redistribution structure for the first laminate electronic component 31.

The second laminate electronic component 32 also includes an electrically conductive layer 47 extending from the semiconductor die 38 on the upper surface of the second dielectric layer 37 to the second via 40 and an electrically conductive layer 48 arranged on the lower surface 43 of the second dielectric layer 37. The electrically conductive layers 47, 48 provide a lateral redistribution structure for the second laminate electronic component 32.

The lower surface 44 of the first laminate electronic component 31 includes at least one contact pad which provides an outer contact pad 45 of the assembly 30. In the embodiment illustrated FIG. 1, the contact pad 45 is electrically coupled to both the first semiconductor die 34 and to the second semiconductor die 38 by the electrically conductive layers 46, 47 and the common conductive layer 41. However, outer contact pads 45 may be provided which are electrically coupled to the first semiconductor die 34 only or to the second semiconductor die 38 only. One or more outer contact pads 45 may not be coupled to any semiconductor die.

In the embodiment illustrated in FIG. 1, the first laminate electronic component 31 and the second laminate electronic component 32 have substantially the same width. The first laminate electronic component 31 and the second laminate electronic component 32 may have substantially the same lateral area or have differing lateral areas.

The semiconductor die 34 embedded in the first dielectric layer 33 and the semiconductor die 38 embedded in the second dielectric layer 37 may include different devices or circuits. For example, the first semiconductor die 34 may include a transistor device and the second semiconductor die 38 may include a control device for controlling the transistor device.

The first laminate electronic component 31 may include a switching device such as a transistor device or a diode or may include two or more semiconductor dice to provide a switching circuit. In some embodiments, the first laminate electronic component 31 includes two transistor devices embedded in the first dielectric layer 33 and configured to provide a half bridge circuit. The second laminate electronic device 32 may include at least one semiconductor die configured to control the one or more of the semiconductor dice embedded in the first laminate electronic component 31. For example, the semiconductor die embedded in the second laminate electronic component 32 may be configured to provide a gate driver and/or control circuitry. The first laminate electronic component 31 and the second laminate electronic component 32 may be configured to provide at least a portion of a voltage regulator.

The first laminate electronic component 31 may include a first contact pad and a second contact pad positioned on the upper side of the first laminate electronic component 31. The second laminate electronic component 32 may be arranged on the upper side of the first laminate electronic component 31 such that it is accommodated between the first contact pad and the second contact pad. The first contact pad and the second contact pad remain uncovered by the second laminate electronic component 32. This arrangement may be used if a further component is to be mounted on the first contact pad and the second contact pad.

This further component may be a discrete inductor, for example. The discrete inductor may include a first contact and a second contact, each having a thickness selected to accommodate a thickness of the second laminate electronic component 32. The second laminate electronic component 32 may be mounted between the first contact pad and the second contact of the discrete inductor. In some embodiments, the discrete inductor further includes a recess in its lower side between the first contact and the second contact. The second laminate electronic component 32 may be accommodated in the recess.

The first via 36 may be arranged in one of a plurality of first signal pads which are arranged in two opposing edge portions of the first major surface 42, i.e. of the upper side, and in two opposing edge regions of the lower side 44 of the first laminate electronic component 31. In embodiments in which the first laminate electronic component 31 includes a large area first contact pad and a large area second contact pad, the plurality of first signal contact pads may be arranged such that the first contact pad and the second contact pad are arranged between the plurality of signal pads arranged in the two opposing edge regions of the first major surface 42 of the first laminate electronic component.

The second via 40 may be arranged in one of a plurality of second signal pads arranged in a least two opposing edge regions of the upper side and at least two opposing edge regions of the lower side 43 of the second laminate electronic component 32. The arrangement of the second signal pads and of the first signal pads may be substantially the same, or a portion of the plurality of second signal pads may have substantially the same arrangement as a portion of the plurality of first signal pads, such that when the second laminate electronic 32 component is arranged on the first laminate electronic component 31, two or more of the first signal pads are in contact with two or more of the second signal pads.

The dielectric layer 33, 37 in which the semiconductor die 34, 38 is embedded may include a prefabricated board, which may include a fiber-reinforced matrix. For example, the dielectric core layer may include a glass fiber-reinforced epoxy resin, such as FR4. The dielectric core layer may include PTFE (Polytetrafluoroethylene), PEN (Polyethylene Naphthalate), PET (Polyethylene Terephthalate), BT laminate (Bismaleimide-Triazine) or Polyimide, for example. The dielectric layer 34, 38 may have a thickness of between 25 μm and 500 μm.

The common conductive layer 41 may include a metal, an alloy or a conductive adhesive. The common conductive layer 41 may also include two or more sublayers, for example multiple metal layers or a metal layer and a solder or a metal layer and an electrically conductive adhesive.

A method which may be used to produce the assembly 30 includes mounting the second laminate electronic component 32 including the at least one semiconductor die 38 embedded in the second dielectric layer 37 on the first laminate electronic component 31 including the first dielectric layer 33 and the at least one first semiconductor die 34 embedded in the first dielectric layer 33. The second contact pad 39 of the second laminate electronic component 32 is electrically coupled with a first contact pad 35 of the first laminate electronic component 31 by introducing conductive material into the second via 40 arranged in the contact pad 39 of the second laminate electronic component 32 and into the first via 36 arranged in the first contact pad 35 of the first laminate electronic component 31 to form the common conductive layer 41.

In embodiments in which two or more contact pads of the first laminate electronic component 31 and/or of the second laminate electronic component 32 include a via, conductive material may be introduced into all of the vias using the same process and in two or more of the vias at substantially the same time.

The method may further include arranging the second contact pad 39 of second laminate electronic component 32 on the first contact pad 35 of the first electronic component 31 and inserting a through-hole into the second contact pad 39 of the second laminate electronic component 32 and into the first contact pad 35 of the first laminate electronic component 31 whilst the second contact pad 39 is arranged on first contact pad 35. The through-hole may also be inserted into the second contact pad 39 and the first contact pad 35 whilst the second laminate electronic component 32 is mounted on the first laminate electronic component 31.

The through-hole or through-holes may be inserted by various methods, including mechanical drilling and laser ablation. The through-hole may also be inserted through the thickness of the second laminate electronic component 32 and through at least the thickness of the first contact pad 35. Some embodiments, at least one through-hole is inserted through the thickness of the second laminate electronic component 32 and through the thickness of the first laminate electronic component 31. One or more through-holes may also be provided which extend through only one of the laminate electronic components, for example in a contact pad which remains uncovered by the other laminate electronic component.

The method may further include arranging a discrete inductor on a first contact pad and on a second contact pad positioned on the first major surface 42 of the first laminate electronic component 31. The first contact pad and the second contact pad may be arranged adjacent opposing sides of the second laminate electronic component 32. The discrete inductor may extend over the second laminate electronic component 32.

In some embodiments, the vias 36, 40 are arranged adjacent the semiconductor dice 34, 38 embedded in the first dielectric layer 33 and in the second dielectric layer 37, respectively. The conductive layer 46 extending from the semiconductor die 34 to the first contact pad 35 in which the via 36 is positioned, provide a redistribution structure with a fan out arrangement.

In FIG. 1, the first contact pad 35 is arranged o the conductive layer 46. However, other arrangements of the contact pads may be provided. For example, a portion of the conductive layer 46 may provide the first contact pad 35.

In some embodiments, a via may extend through the thickness of one laminate electronic component and be vertically aligned with a via which extends only partially through the thickness of a contact pad of the second laminate electronic component or only partially through the thickness of the second laminate electronic component. In these embodiments, the semiconductor die may be arranged directly underneath the contact pad in the second laminate electronic component.

Figure 2A:
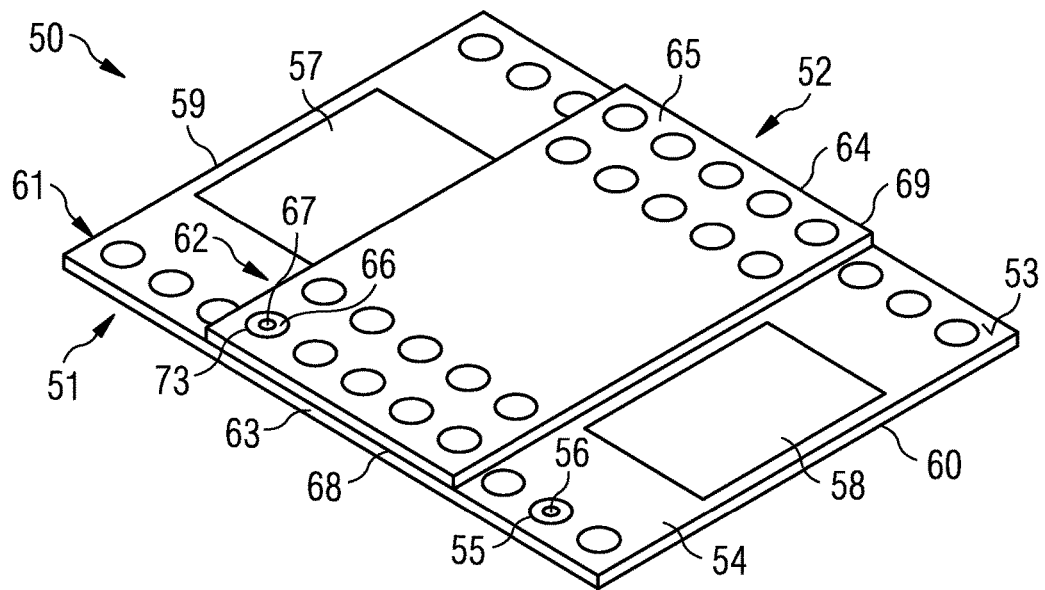
FIG. 2a illustrates a perspective top view of an assembly according to a second embodiment.
Figure 2B:
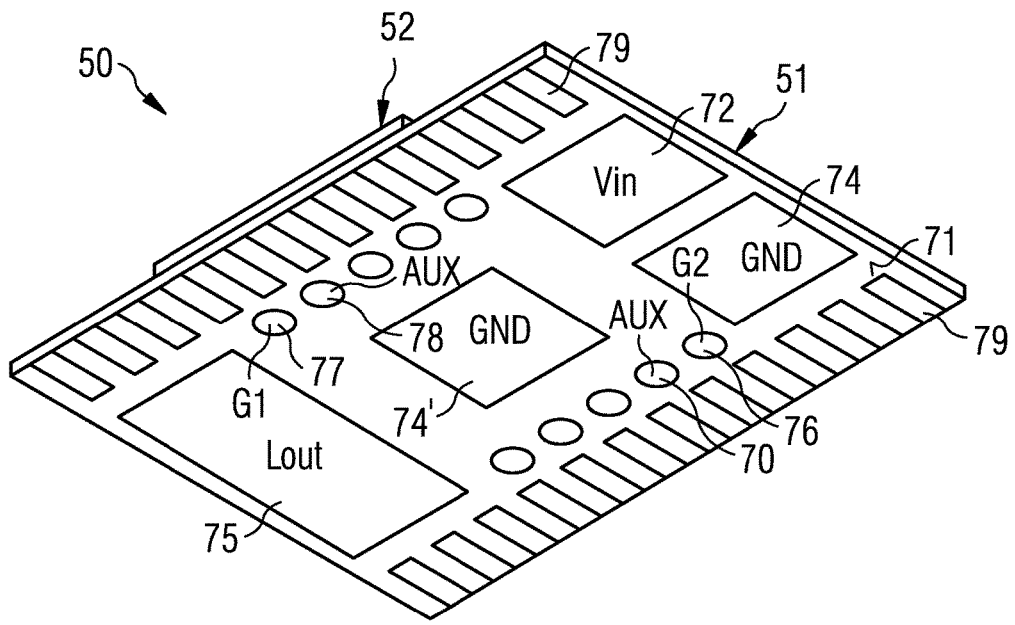
FIG. 2b illustrates a perspective bottom view of the assembly according to the second embodiment.

FIG. 2a illustrates a perspective top view of an assembly 50 and FIG. 2b illustrates a perspective bottom view of an assembly 50 according to a second embodiment.

The assembly 50 includes a first laminate electronic component 51 and a second laminate electronic component 52 which is arranged on an upper surface 53 of the first laminate electronic component 51. The first laminate electronic component 51 includes a first dielectric layer 54 which may include a prefabricated board such as a glass fiber-reinforced epoxy resin. The first laminate electronic component 51 includes at least one first semiconductor die, which is not seen in the views illustrated in FIGS. 2a and 2b, embedded in the first dielectric layer 54 and at least one first contact pad 55 including a first conductive via 56. The first laminate electronic component 51 may include two or more semiconductor dice, for example two transistor devices configured to provide a half bridge circuit.

The first laminate electronic component 51 further includes two large contact pads 57, 58 arranged in two opposing edge regions 59, 60 of the upper surface 53. The first laminate electronic component 51 includes two rows 61, 62 of smaller area contact pads 55 arranged on the upper surface 53 in two opposing edge regions 63, 64 such that the larger area contact pads 57, 58 are arranged between the two rows 61, 62 of the smaller area contact pads 55. The outermost row 61 of contact pads includes a larger number of contact pads than the inner row 62. The centre portion of the first row 61 and the second row 62 of contact pads 55 are covered by the second laminate electronic component 52. The smaller area contact pads 55 may provide signal contact pads, gate contact pads, sense contact pads, logic contacts pads etc.

The first conductive via 56 extends between a contact pad 55 arranged on the upper surface 53 of the first dielectric layer 54 and one of the contact pads 70 arranged on the lower surface 71 of the first dielectric layer 54. The contact pads 70 on the lower surface 71 have substantially the same layout as the smaller area contact pads 55 on the upper surface 53. However the size and outer contour of the contact pads 55, 70 may vary. For example the outermost row 61 of contact pads 70 on the lower surface have a substantially rectangular shape whereas the outermost row 61 of contact pads 55 on the upper surface 55 have a substantially circular shape.

The second laminate electronic component 52 includes a second dielectric layer 65 and at least one second semiconductor die, which is not seen in the views illustrated in FIGS. 2a and 2b, embedded in the second dielectric layer 65. The second dielectric layer 65 includes a prefabricated board such as a glass fiber-reinforced epoxy resin. The second laminate electronic component 52 further includes at least one second contact pad 66 which includes a second conductive via 67.

The second laminate electronic component 52 is mounted on the upper surface 53 of the first laminate electronic component 51 such that it extends between the edge regions 63, 64 and is arranged between the larger area contact pads 57, 58. The second laminate electronic component 52 includes a plurality of contact pads 66 arranged in two opposing edge regions 68, 69 such that at least one of the contact pads 66 is mounted on one of the contact pads 55 arranged on the upper surface 53 of the first laminate electronic component 51.

In particular, the conductive via 67 of the contact pad 66 of the second laminate electronic component 52 is vertically aligned with a conductive via 56 arranged on the contact pad 55 of the first laminate electronic component 51. The first conductive via 56 is electrically coupled to the second conductive via 67 by a common conductive layer 73. For example, the second conductive via 67 extends through the thickness of the second dielectric layer 65 and the first conductive via 56 extends through the thickness of the first dielectric layer 54 and the conductive material 73 extends from the first conductive via 56 to the second conductive via 67 and electrically couples the second laminate electronic component 52 with the first laminate electronic component 51. The conductive material 73 may also electrically couple at least one semiconductor die of the second laminate electronic component 52 with at least one semiconductor die of the first laminate electronic component 51. The conductive material 73 may include an electrodeposited metal or alloy layer.

In embodiments in which the first laminate electronic component 51 includes a half bridge circuit, the second laminate electronic component 52 may include a logic chip such as a control chip including gate driver circuitry, for example, for controlling the half bridge circuit. In this embodiment, one of the large area contact pads 57 of the first laminate electronic component 51 may be an $L_{out}$ contact pad.

The first laminate electronic component 51 further includes a plurality of contact pads on its lower surface 71 which may be used to electrically couple the assembly 50 to a printed circuit board. The first laminate electronic component 51 includes one or more larger area contact pads in the central region of the lower surface 71 and a plurality of smaller area contact pads 70 arranged in two opposing edge regions. The larger area contact pads may include a $V_{in}$ contact pad 72, a ground contact pad 74, a further ground contact pad 74' for the second semiconductor die embedded in the second laminate electronic component 52 and an $L_{out}$ contact pad 75. The smaller area contact pads 70 may include a first gate contact pad 76, a second gate contact pad 77, one or more auxiliary contact pads 78, for example for providing sense functions. The gate contact pads 76, 77 and the auxiliary contact pads 78 may be arranged in a second row adjacent a row 62 adjacent a row 61 of signal contact pads 79 arranged at the periphery of two opposing sides 68, 69 of the first laminate electronic component 51. One or more of the contact pads 70 arranged on the lower surface 71 of the first laminate electronic component provides access to the upper second laminate electronic component 52 of the stacked assembly 50 by means of the vias structure and conductive material 73 arranged in the via which is common to both the first laminate electronic component 51 and the second laminate electronic component 52.

However, the arrangement of the contact pads is not limited to the particular example illustrated in FIGS. 2a and 2b and may vary. For example, signal contacts 79 may be arranged on one side, three or all sides of the first laminate electronic component 51, fewer or more larger area contact pads 72, 74, 74', 75 may be provided, the lateral area of the contact pads may be vary. The number and layout of the contact pads may be configured depending on the circuit provided by the first laminate electronic component 51 and/or second laminate electronic component 52.

Figure 3A:
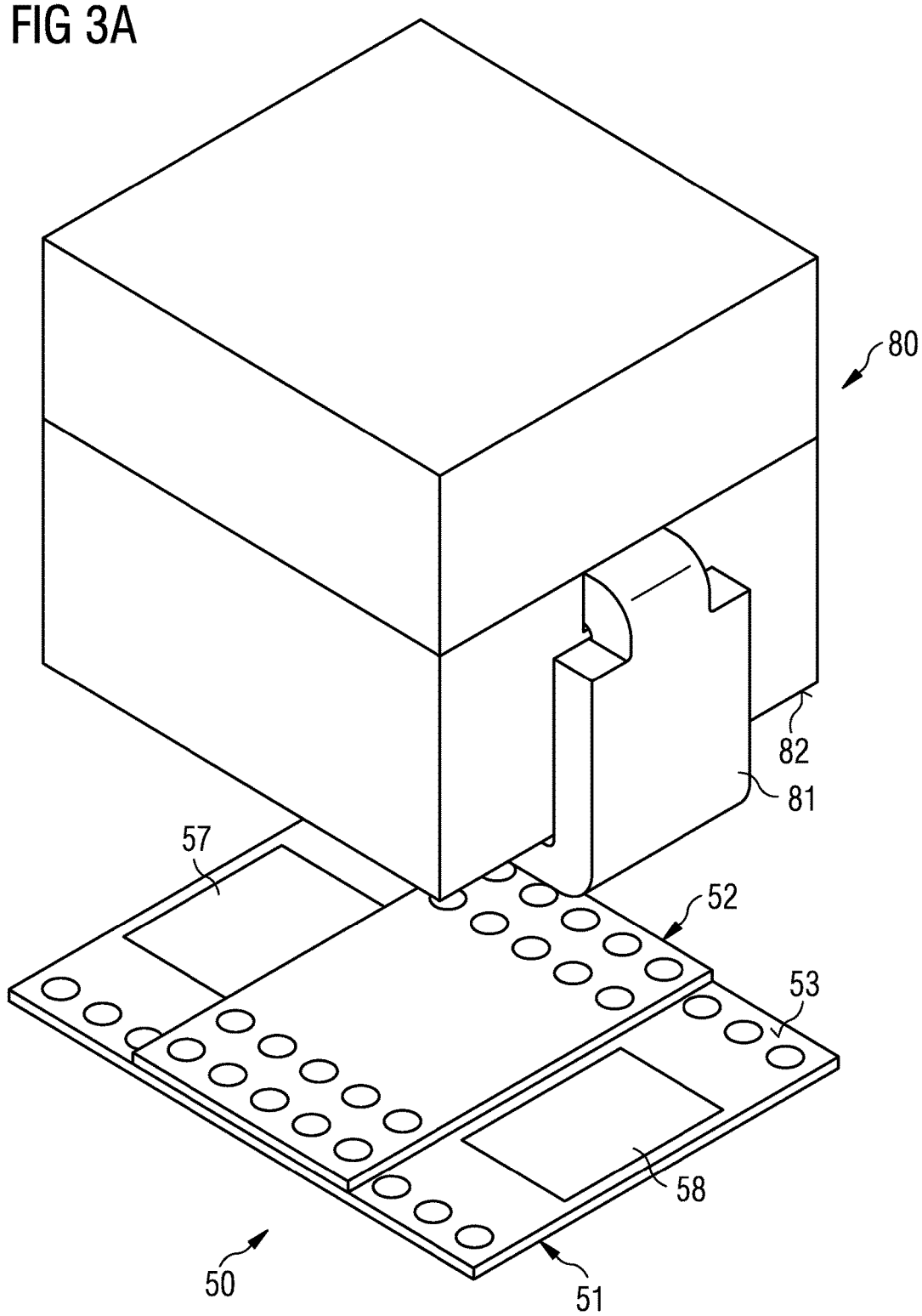
FIG. 3a illustrates an exploded view of the assembly according to the second embodiment and an inductor.

FIG. 3a illustrates an exploded view and FIG. 3b a perspective view of the assembly 50 and an inductor 80 which is provided in the form of a discrete component including two contacts, of which only a single contact 81 is illustrated in the perspective view of the drawings.

The inductor 80 is mounted on the assembly 50 such that the two contacts 81 are mounted on the larger area contacts 57, 58 on the upper surface 53 of the first laminate electronic component 51 and such that the thickness of the second laminate electronic component 52 is accommodated by the thickness of the contacts 81 and/or is accommodated in a recess in the lower surface 82 of the discrete inductor 80. One of the contacts 81 may be electrically coupled to the $L_{out}$ contact pad 57 of the first laminate electronic component 51. The second contact pad may be electrically coupled to the second larger area contact pad 58 or may be only mechanically joined to the second electronic component 58. The second contact pad provides an output from the discrete inductor 80.

The arrangement of the assembly 50 underneath the discrete inductor 80 provides a compact assembly 83 which may be used to save space on a printed circuit board over an arrangement in which two or all of the components are arranged adjacent one another on the printed circuit board.

The use of the separate components, i.e. the first laminate electronic component 51, the second laminate electronic component 52 and the discrete inductor 80, enables each component to be separately manufactured and tested and then assembled. This enables the assembly 83 to be fabricated from components which are known to function correctly. Furthermore, different methods of differing processes may be used to fabricate the two laminate components. The second laminate electronic component 52 may include a finer conductive redistribution structure if the semiconductor die includes a logic device, whereas a larger redistribution structure with a greater thickness of the conductive layers may be more appropriate for the first laminate electronic component 51 if the first electronic component 51 includes a power device, such as a power transistor device.

Additionally, portions of the assembly can be adapted to a particular need by selected an appropriate component. For example, the inductance of the inductor 80 may differ depending on the application. Therefore, the assembly 50 may be used in differing applications by selecting a suitable inductor.

Figure 24:
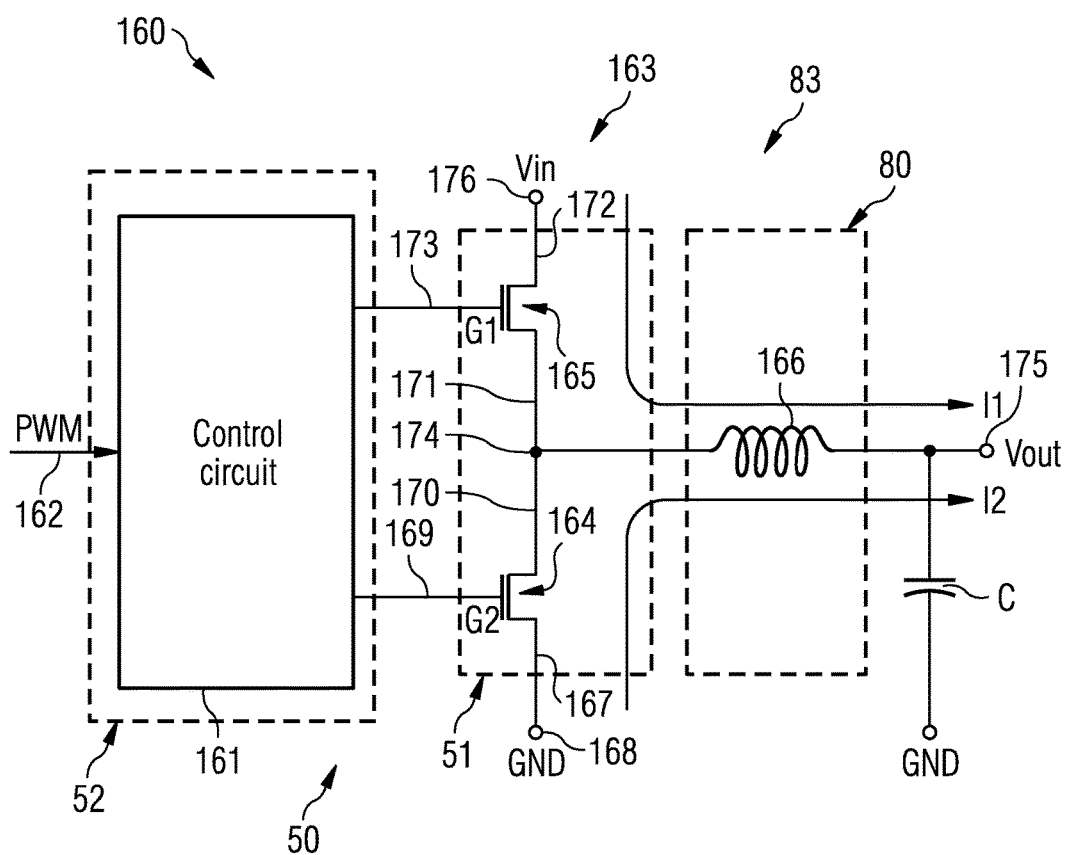
FIG. 24 illustrates a circuit diagram of a voltage regulator including an assembly according to one of the embodiments and an inductor.

The combination of the assembly 50 and the discrete inductor 80 may be used in a voltage regulator circuit such as that illustrated in FIG. 24.

FIGS. 4 to 11 illustrate a method that may be used to fabricate the first laminate electronic component 51. FIGS. 12 to 16 illustrate a method which may be used to fabricate the second laminate electronic component 52. FIGS. 17 to 23 illustrate a method which may be used to form the assembly 50 and to electrically couple the first laminate electronic component 51 with the second laminate electronic component 52.

Figure 4:
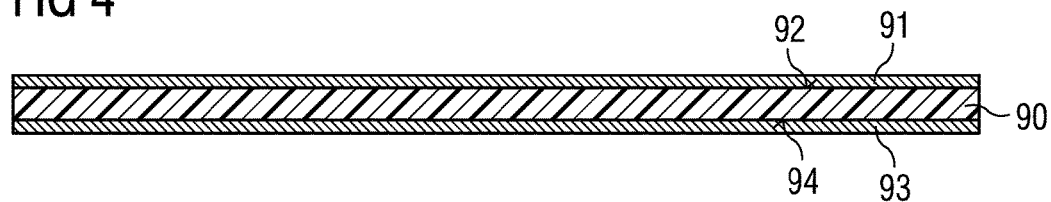
FIG. 4 illustrates a dielectric layer of a first laminate electronic component according to a third embodiment.

FIG. 4 illustrates a first dielectric layer 90 including a self-supporting board. The dielectric layer 90 may include a glass fiber-reinforced epoxy resin such as FR4, for example. A metallic foil 91 is arranged on a first major surface 92 of the dielectric layer 90 and a second metallic foil 93 is arranged on a second major surface 94 of the dielectric layer 90. The metallic foils 91, 93 may include copper, for example, and may be attached to the dielectric layer 90 by adhesive.

Figure 5:
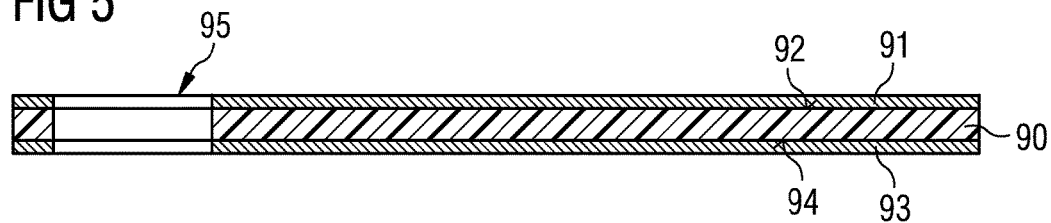
FIG. 5 illustrates the dielectric layer with an aperture, according to an embodiment.

FIG. 5 illustrates the dielectric layer 90 after the introduction of an aperture 95 which extends through the first metallic foil 91, through the thickness of the dielectric layer 90 and through the second metallic layer 93 such that the aperture 95 is open ended. In other non-illustrated embodiments, the aperture has the form of a recess with a base. The base may be formed by a portion of the dielectric layer 90 or by one of the metallic foils, for example the metallic foil 93. The aperture may be formed by mechanical drilling or laser ablation. Two or more apertures may be formed in the dielectric layer 90 if two or more semiconductor dice or other components are to be embedded in the dielectric layer 90.

Figure 6:
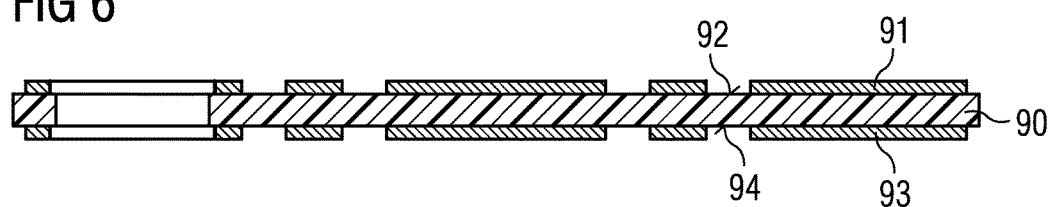
FIG. 6 illustrates structured metallic foil positioned on the dielectric layer, according to an embodiment.

FIG. 6 illustrates the dielectric layer 90 after the first metallic foil 91 and the second metallic foil 93 have been structured. Portions of the first metallic layer 91 and second metallic layer 93 are removed such that the remaining portions provide contact pads and/or a lateral redistribution structure.

Figure 7:
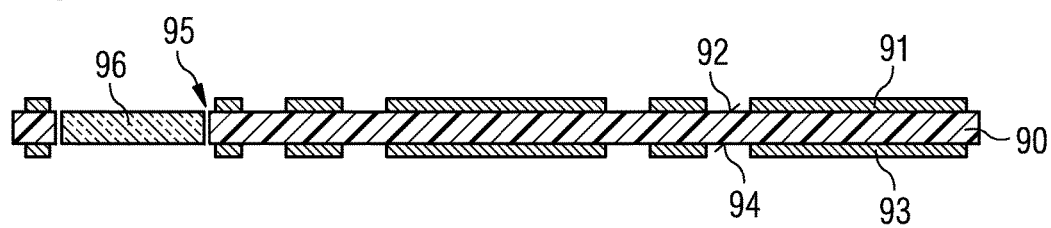
FIG. 7 illustrates a semiconductor die positioned in the dielectric layer, according to an embodiment.

FIG. 7 illustrates the insertion of a semiconductor die 96 in the aperture 95. The semiconductor die 96 has a height which is substantially the same as the thickness of the dielectric layer 90. In some embodiments, the semiconductor die 96 may have a height which is slightly less or slightly greater than the thickness of the dielectric layer 90.

Figure 8:
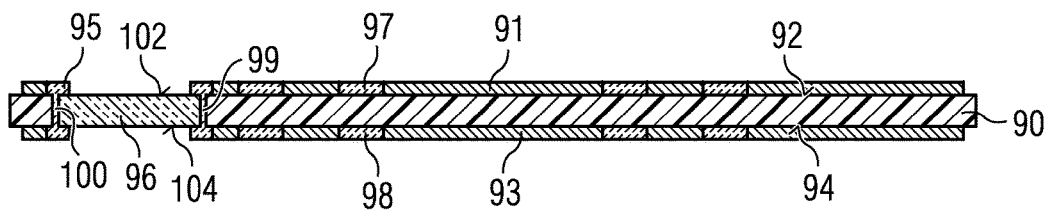
FIG. 8 illustrates a further dielectric layer arranged on the dielectric layer, according to an embodiment.

As is illustrated in FIG. 8, a dielectric layer 97 is applied to the upper surface 92 and a dielectric layer 98 is applied to the lower surface 94 of the dielectric layer 90 such that regions 99 between the semiconductor die 96 and sidewalls 100 of the aperture 95 are substantially filled with dielectric material and such that regions of the dielectric layer 97, 98 are arranged between the remaining portions of the structured metallic layers 91, 93. The dielectric layers 97, 98 may include a dielectric material which can be structured by photolithographic techniques. The dielectric layers 97, 98 may include polyimide, for example.

The dielectric layers 97, 98 have a planarizing function if the thickness of the dielectric layers 97, 98 is substantially the same as the thickness of the metallic layers 91, 93. The dielectric layer 97, 98 is arranged on at least peripheral regions of the first major surface 102 and second major surface 103 of the semiconductor die 96 such that the semiconductor die 96 is secured in the aperture 95 by dielectric material having a substantially I-shaped cross-section. In other embodiments, the dielectric layer may be applied such that one of the major surfaces of the semiconductor die 96 is substantially or entirely covered by a dielectric layer.

Figure 9:
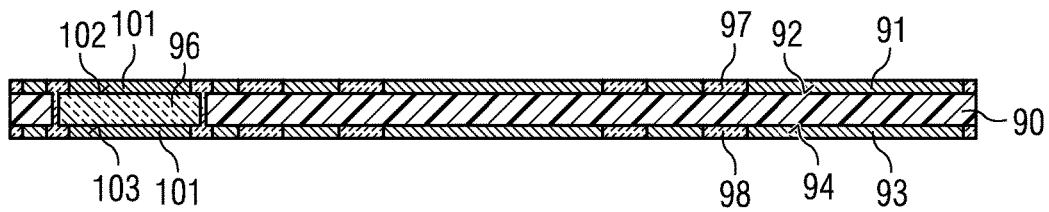
FIG. 9 illustrates a conductive layer applied to the semiconductor die, according to an embodiment.

An electrically conductive layer 101, for example a metallic layer, is applied to at least portions of at least one major surface 102 of the semiconductor die 96, as is illustrated in FIG. 9. In embodiments in which the semiconductor die 96 is a vertical device, such as a vertical transistor device or a vertical diode, the electrically conductive layer 101 may be applied to two opposing major surfaces 102, 103 of the vertical device.

In embodiments, in which the semiconductor die 96 is a vertical transistor device, the electrically conductive layer 101 can be applied to a first current electrode and a control electrode which are positioned on one of the major surfaces, for example the first major surface 102, and to a second current electrode which is arranged on the opposing major surface, for example the second major surface 103, of the transistor device 96. The electrically conductive layer 101 may be applied by an electrodeposition technique to both the major surfaces 102, 103 of the semiconductor die 96 substantially simultaneously.

In embodiments, in which the semiconductor die 96 includes a transistor device, such as a power transistor device having a vertical drift path, the power transistor device may include a MOSFET, an Insulated Gate Bipolar Transistor (IGBT) or a Bipolar Junction Transistor (BJT). For MOSFET devices, the first current electrode may be a source electrode, the control electrode may be a gate electrode and the second current electrode may be a drain electrode. For IGBT devices, the first current electrode may be an emitter electrode, the control electrode may be a gate electrode and the second current electrode may be a collector electrode. For BJT devices, the first current electrode may be an emitter electrode, the control electrode may be a base electrode and the second current electrode may be a collector electrode.

Figure 10:
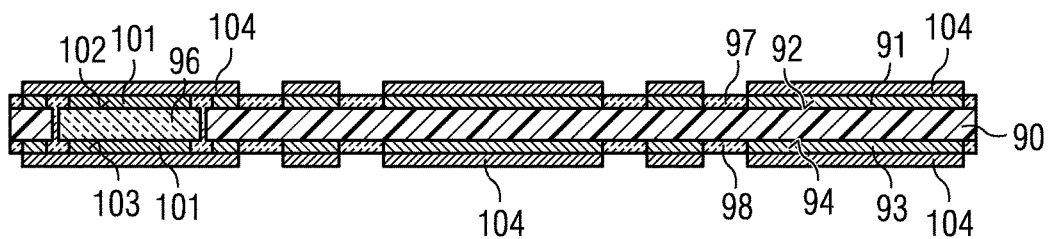
FIG. 10 illustrates a further conductive layer applied to the semiconductor die and to the structured metal foil, according to an embodiment.

A second electrically conductive layer 104 is applied, as illustrated in FIG. 10. The second conductive layer 104 is applied to the first electrically conductive layers 91, 93 arranged on first major surface 92 and the second major surface 94 of the dielectric layer 90 and on the conductive layer 101 arranged on the semiconductor die 96.

The electrically conductive layers 101, 104 may be applied by electroless plating or electroplating, for example. In some embodiments, a seed layer may be deposited using a different technique, for example sputtering, before a thicker metallic layer is applied using a electroplating technique.

Figure 11:
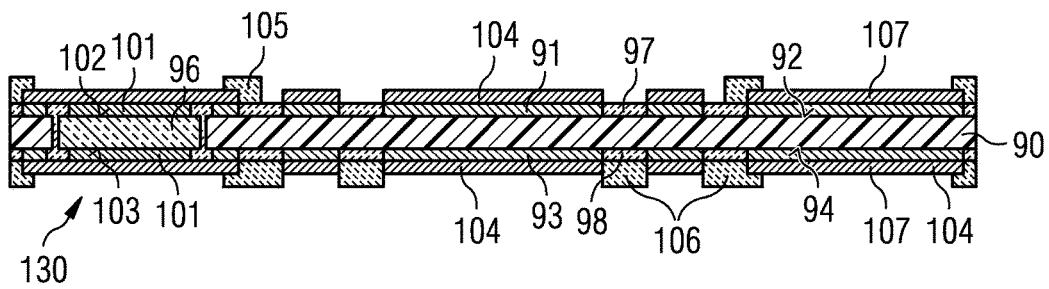
FIG. 11 illustrates a further dielectric layer applied to the structured metal foil, according to an embodiment.
Figure 12:
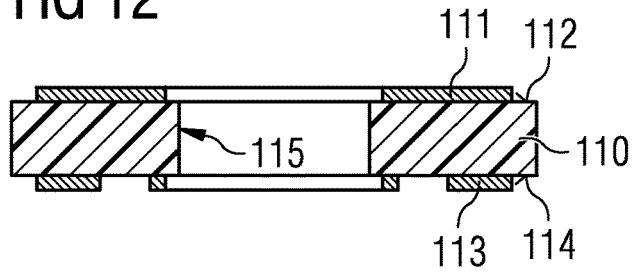
FIG. 12 illustrates a dielectric layer for a second laminate electronic component, according to an embodiment.

A further dielectric layer 105, 106 may be applied to some or all of the first dielectric layer 97, 98 such that it protrudes above the outer surface of the electrically conductive layer 104, as is illustrated in FIG. 11. The electrically conductive regions which remain exposed from the dielectric layers 105, 106 provide contact pads 107.

The method illustrated in FIGS. 4 to 11 may be used to fabricate a first laminate electronic component including more than one semiconductor die. In which case, an aperture is inserted in the dielectric layer 90 for each semiconductor die. The electrically conductive layers 91, 93, 101, 104 may be structured and applied in order to electrically couple semiconductor dice to one another and to provide the desired arrangement of the contact pads 107 on the lower surface and on the upper surface of the dielectric layer 90. In embodiments in which semiconductor dice include transistor devices, the transistor devices may be configured to provide a half bridge circuit.

A method which may be used to fabricate the second laminate electronic component 51 is illustrated in FIGS. 12 to 16.

A second dielectric layer 110 is provided which includes a first metallic layer 111 arranged on a first major surface 112 and a second metallic layer 113 arranged on a second major surface 114. The dielectric layer 110 may be a self-supporting board such as glass fiber-reinforced epoxy board and the first and second metallic layers 111, 113 may include copper, for example.

The metallic layers 111, 113 are structured to provide contact pads and a redistribution structure on the first major surface 112 and on the second major surface 114 of the dielectric layer 110. The portions of the structured metallic layers 111, 113 are electrically insulated from one another by intervening regions of the dielectric layer 110.

An aperture 115 is inserted through the first metallic layer 111 through the thickness of the dielectric layer 110 and through the second metallic layer 113. The aperture 115 has a lateral size configured to accommodate a semiconductor die.

Figure 13:
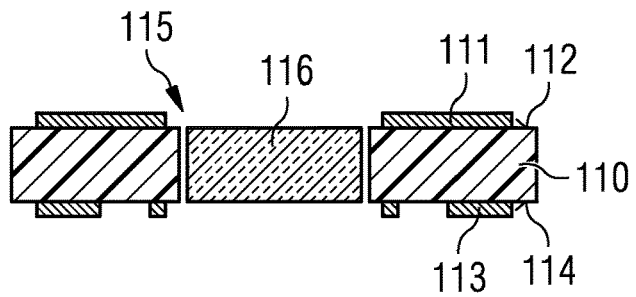
FIG. 13 illustrates a semiconductor die arranged in the dielectric layer for the second laminate electronic component, according to an embodiment.
Figure 14:
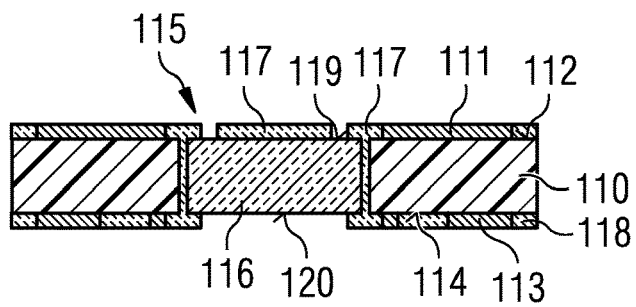
FIG. 14 illustrates a dielectric layer arranged on the semiconductor die and the dielectric layer, according to an embodiment.

The semiconductor die 116 is inserted in the aperture 115, as is illustrated in FIG. 13. The semiconductor die 116 may include a logic device. A dielectric layer 117 is applied to the first major surface 112 and a second dielectric layer 118 is applied to the second major surface 114 of the dielectric layer 111, as is illustrated in FIG. 14. The dielectric layer 117 is arranged on the first major surface 112 of the dielectric layer 110 in regions adjacent to the remaining portions of the metallic foil 111 and on regions of a first major surface 119 of the semiconductor die 116 such that contact pads on the first major surface 119 of the semiconductor die 116 are exposed from the dielectric layer 117.

The second dielectric layer 118 is positioned on the second major surface 114 of the dielectric layer 110 between portions of the metallic layer 113 and on peripheral regions of the second major surface 120 of the semiconductor die 116. The central region of the first major surface 102 remains uncovered by the second dielectric layer 118. The second dielectric layer 118 is also arranged between side faces of the semiconductor die 116 and side faces of the aperture 115. This portion of the dielectric layer 118 may be used to secure the semiconductor die in the aperture 115 and may provide a securing element with a substantially I-shape.

Figure 15:
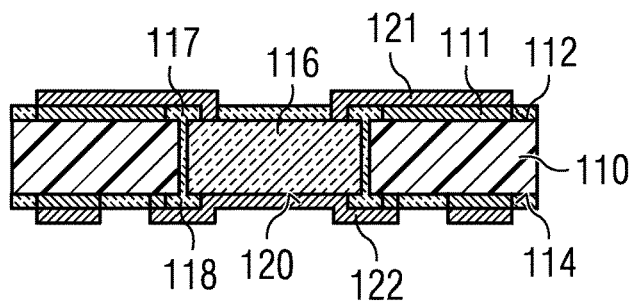
FIG. 15 illustrates a conductive layer arranged on the semiconductor die and the dielectric layer, according to an embodiment.

The arrangement of further conductive layers 121, 122 is illustrated in FIG. 15. An electrically conductive layer 121 is applied to the first major surface 112 of the dielectric layer 110 such that it extends between the contact pads arranged on the first major surface 119 of the semiconductor die 116 over portions of the dielectric layer 117 arranged peripheral to the semiconductor chip and onto portions of the metallic foil 111. The electrically conductive layer 121 electrically couples the semiconductor die 116 to portions of the metallic foil 111 arranged on the dielectric layer 110. The electrically conductive layer 121 provides a fan-out type of redistribution.

A second conductive layer 122 is arranged on the second major surface 114 of the dielectric layer 110 and on portions of the metallic foil 113 on the second major surface 120 of the semiconductor die such that it extends over the dielectric layer 118 arranged in peripheral regions of the second major surface 120 of the semiconductor die 116 to portions of the metallic foil 113 arranged on the dielectric layer 110 adjacent to the aperture 115.

Figure 16:
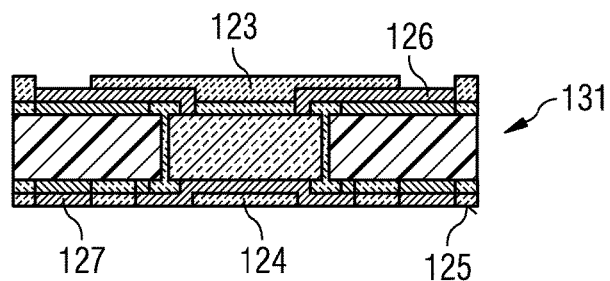
FIG. 16 illustrates a second dielectric layer arranged on the conductive layer, according to an embodiment.

A further dielectric layer 123 is applied to the first major surface 112 of the dielectric layer 110. As is illustrated in FIG. 16, the further dielectric layer 123 covers portions of the conductive layer 121 and the dielectric layer 117 leaving regions of the metallic layer 121 uncovered to provide contact pads 126. A further dielectric layer 124 is applied to the second major surface 114 of the dielectric layer 110 in regions between portions of the conductive layer 122 which provide contact pads 127 to provide a planar lower surface 125.

The semiconductor die 116 may be a logic device which may include control circuitry for further semiconductor devices. In embodiments in which the first laminate electronic component includes one or more transistor devices, the semiconductor die 116 may include control circuitry for the transistor devices, for example gate driver circuitry. The dielectric core layer 110 may be thicker than the dielectric core layer 90 used for the first laminate electronic component, since logic devices are typically have typically a greater height than transistor devices.

The methods disclosed in methods illustrated in FIGS. 4 to 11 and 12 to 16 are illustrated in terms of a single component. However, typically, the method is performed using a large sheet including a number of component positions typically arranged in rows and columns Each of the layers and is procedures described with reference to FIGS. 4 to 11 is applied to all of the component positions. The sheets may then be singulated to provide two separate intermediate products for stacking to form an assembly. Alternatively, the upper component of the stack may be provided as an individual component which is mounted on a sheet comprising a plurality of component positions including the lower component of the stack.

A method for stacking and electrically coupling the first laminate electronic component 130 illustrated in FIG. 11 with the second laminate electronic component 131 illustrated in FIG. 16 to form an assembly will be described with reference to FIGS. 17 to 23.

Figure 17:
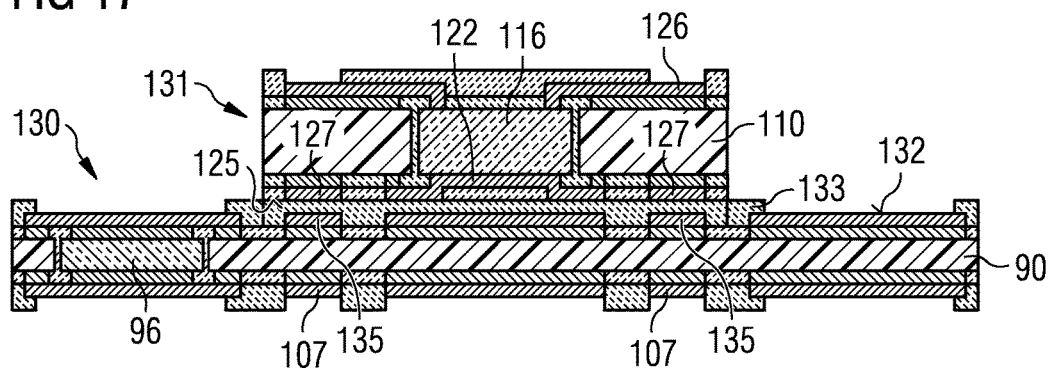
FIG. 17 illustrates the second laminate electronic component stacked on the first laminate electronic component, according to an embodiment.

FIG. 17 illustrates that the second laminate electronic component 131 is mounted on the first laminate electronic component 130. In particular, the lower surface 125 of the second laminate electronic component 131 including the contact pads 127 provided by portions of the electrically conductive layer 122 is mounted on the upper surface 132 of the first laminate electronic component 130. In particular, at least one of the contact pads 127 of the second laminate electronic component 131 is arranged directly above a contact pad 135 provided by portions of the electrically conductive layer 104 on the upper surface 132 of the first laminate electronic component 130. The second laminate electronic component 131 may be mechanically attached to the first laminate electronic component 130 by a layer of adhesive 133 arranged between the lower surface 125 of the second laminate electronic component 131 and the upper surface 132 of the first laminate electronic component. The adhesive may be electrically insulating and may cover the contact pads 127, 135.

Figure 18:
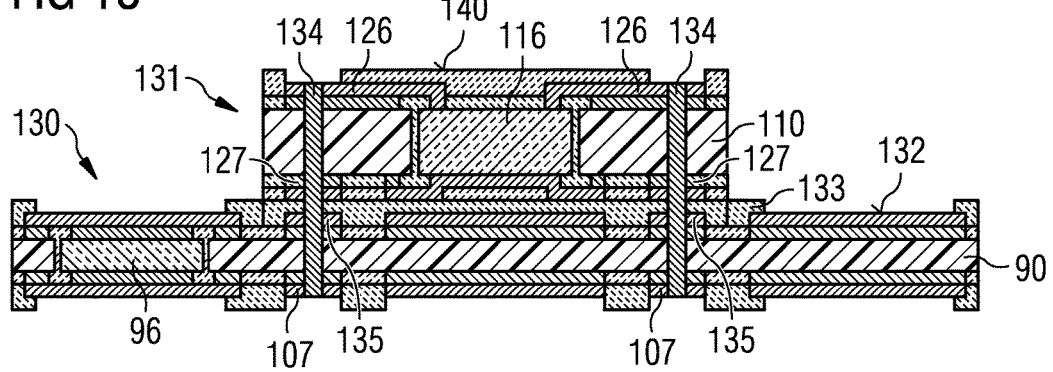
FIG. 18 illustrates through-holes introduced into the second laminate electronic component and the first laminate electronic component, according to an embodiment.

A through-hole 134 is introduced through the second laminate electronic component 131 and the first laminate electronic component 130 such that the through-hole 134 is arranged in the contact pads 126, 127 of the second laminate electronic component 131 and through the contact pads 135, 107 of the first laminate electronic component 130, respectively. The position of the through-holes 134 is illustrated in FIG. 18.

The through-holes 134 are positioned adjacent side faces of the semiconductor dice 105, 116 of the first laminate electronic component 130 and the second laminate electronic component 131. The through-holes 134 may be inserted from the upper surface 137 of the second laminate electronic component 131 such that they extend through the second laminate electronic component 131 and through the first laminate electronic component 130 and such that they are positioned in substantially the centre of the contact pads 126, 127, 135, 107.

Figure 19:
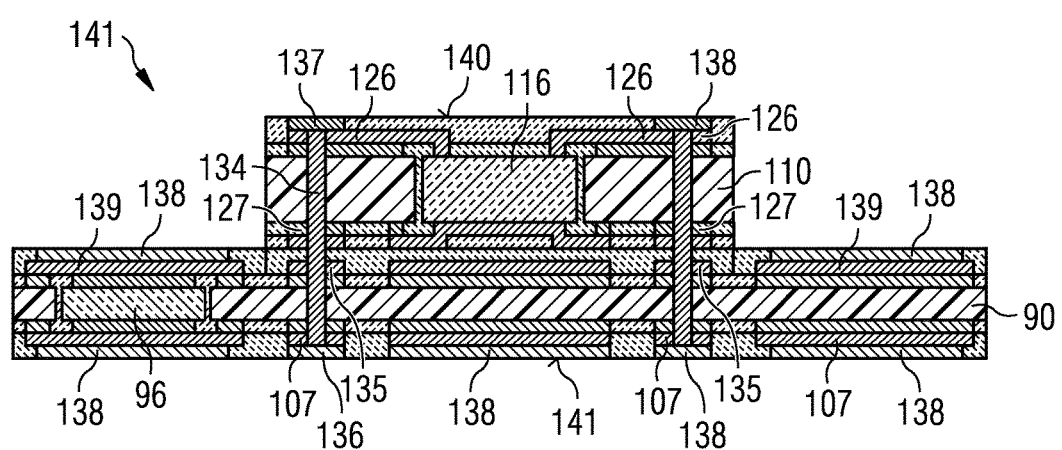
FIG. 19 illustrates the conductive material arranged in the through-holes, according to an embodiment.

Conductive material 136 is introduced into the through-holes 134, for example by depositing a metal by electroplating, such that a common conductive layer 137 is provided which extends between, and electrically couples, at least the contact pad 127 to the contact pad 135 and electrically couples the first laminate electronic component 130 with the second laminate electronic component 131. The common conductive layer 137 may extend between and electrically couple all of the contact pads 126, 127, 135, 107 arranged in a stack. During the introduction of this conductive material 136 into the through-holes 134, conductive material may also be applied as a layer 138 on exposed metal regions of the contact pads 126 on the upper surface 140 of the second laminate electronic component 131, on exposed electrically conductive regions 139 on the upper surface 132 and contact pads 107 of the lower surface 141 of the first laminate electronic component 130, as is illustrated in FIG. 19. The contact pads 107 on the lower surface 141 provide outer contacts pads of the assembly for accessing both the first laminate electronic component 130 and the second laminate electronic component 131.

The thickness of this electrically conductive layer 138 may correspond to the thickness of the dielectric layer 123 of the second laminate electronic component 131 surrounding the exposed contact pads 126 and to the thickness of the dielectric layers 121 and 122 of the first laminate electronic component 130.

In embodiments in which a plurality of through-holes 134 are inserted into the first laminate electronic component 130 and the second laminate electronic component 131, conductive material 136 may be introduced into all of the through-holes 134 using the same deposition process.

Figure 20A:
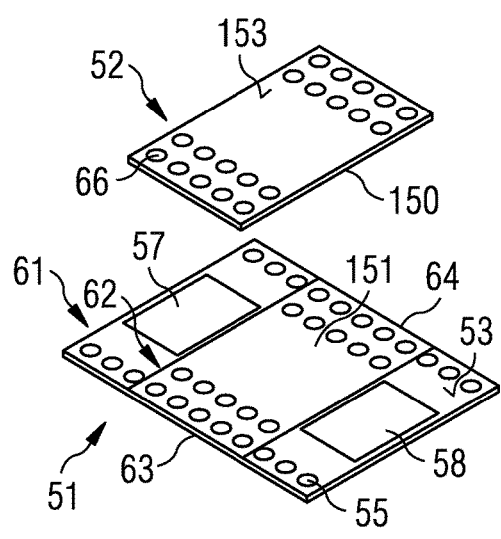
FIG. 20a illustrates a top perspective exploded view of the assembly according to the second embodiment, according to an embodiment.
Figure 20B:
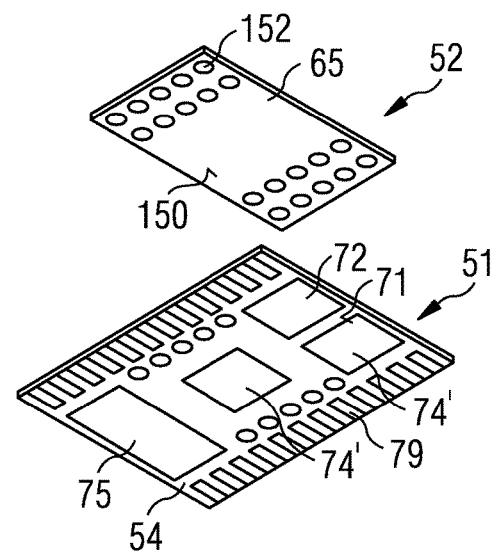
FIG. 20b illustrates a bottom perspective exploded view of the assembly according to the second embodiment.

A method for assembling the assembly 50 including the first laminate electronic component 51 and the second laminate electronic component 52 illustrated in FIG. 2 will now be described with reference to FIGS. 20 to 23. FIG. 20*a* illustrates a top perspective view and FIG. 20*b* illustrates a bottom perspective view of the first laminate electronic component 51 and the second laminate electronic component 52. The lower surface 150 of the second laminate electronic component 52 is mounted on the upper surface 53 of the first laminate electronic component 51 by a layer of adhesive 151. The layer of adhesive 151 is arranged between the two larger area contact pads 57, 58 and may surround the two rows 61, 62 of smaller contact area pads 55 arranged on the upper surface 53 of the first laminate electronic component 51.

The lower surface 150 of the second laminate electronic component 52 include a plurality of contact pads 152 having a lateral arrangement corresponding to the lateral arrangement of the contact pads 66 on the upper surface 153.

Figure 21:
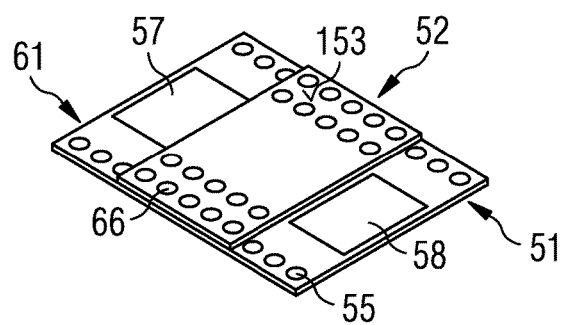
FIG. 21 illustrates the assembly according to the second embodiment with the second laminate electronic component mounted on the first laminate electronic component.

The second laminate electronic component 51 is arranged on the upper surface 53 of the first laminate electronic component 51 such that it is arranged between the two larger area contacts 57, 58 and such that each contact pad 66 is vertically aligned with the contact pads 55 arranged on the upper surface 53 of the first electronic laminate electronic component 51 as is illustrated in the top perspective view of FIG. 21.

Figure 22A:
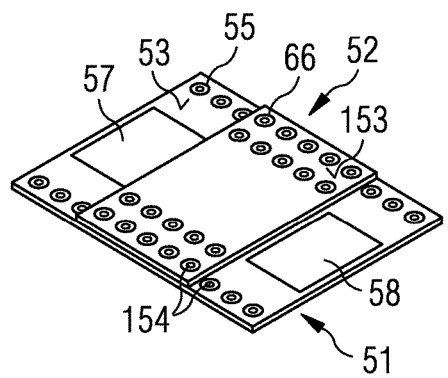
FIG. 22a illustrates through-holes positioned in contact pads of the first laminate electronic component and the second laminate electronic component of the assembly according to the second embodiment.
Figure 22B:
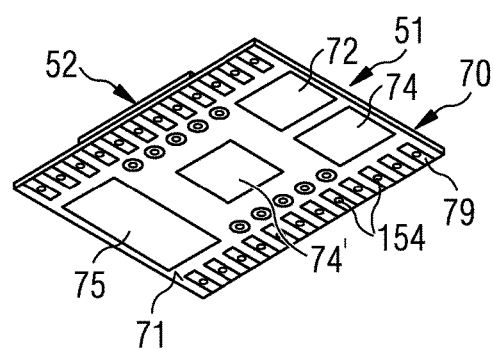
FIG. 22b illustrates a bottom view of through-holes positioning contact pads of the first laminate electronic component and the second laminate electronic component of the assembly according to the second embodiment.

FIG. 22*a* illustrates a top perspective view and FIG. 22*b* illustrates a bottom perspective view of a plurality of through-holes 154 inserted into the contact pads 55, 70, 66, 152. A single through-hole 154 having a diameter less than the diameter or width of the contact pads 55, 70, 66, 152 is positioned in each of the contact pads 55, 70, 66, 152.

The through-holes 154 may be inserted from the upper surface 153 of the second laminate electronic component 52 such that they extend through the thickness of the second laminate electronic component 52 and through the thickness of the first laminate electronic component 51.

A single through-hole 154 is positioned in a contact pad 66, arranged on the upper surface 153 of the second electronic component 52, the contact pad 152 positioned on the lower surface of the second laminate electronic component 52, the contact pad 55 positioned on the upper surface 53 of the first laminate electronic component 51 and contact pad 70 positioned on the lower surface of the first laminate electronic component 51.

The through-holes 154 may be inserted from top side of the first laminate electronic component 51 into contact pads 55 which remain uncovered by the second laminate electronic component 52. The through-holes 154 may extend through the entire thickness of the first laminate electronic component 51 and the contact pads 55, 70.

Through-holes are not inserted into the larger area contact pads 72, 74, 74', 75 in the embodiment illustrated in FIG. 22. However, through-holes may be inserted into larger area contact pads and/or into fewer than all of the smaller area contact pads.

Electrically conductive material 155 is inserted into the through-holes 154 to electrically couple the contact pads 66 on the upper surface 153 the second laminate electronic component 52 and to contact pads 70 on the lower surface 71 of the first laminate electronic component 50 by means of the through-holes 154 which extend between aligned contact pads 66, 152 of the second laminate electronic component 52 and aligned contact pads 55, 70 the first laminate electronic component 51 by a common layer of conductive material 155.

Figure 23A:
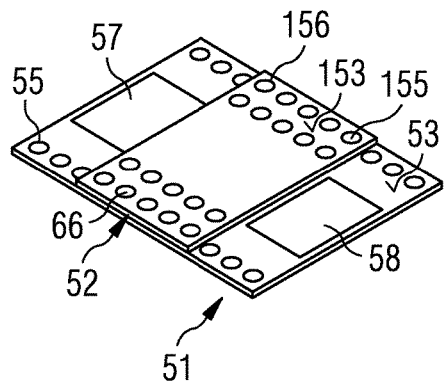
FIG. 23a illustrates a top perspective view of the assembly of the introduction of conductive material into the through-holes, according to an embodiment.
Figure 23B:
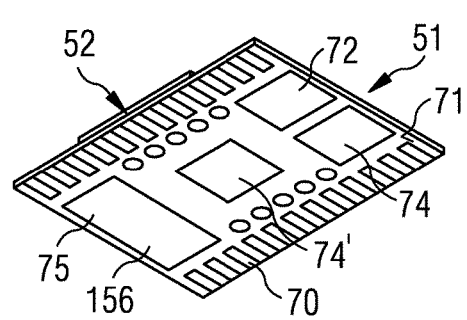
FIG. 23b illustrates a bottom perspective view of the first laminate electronic component with conductive material positioned in the through-holes to form the assembly according to the second embodiment.

The electrically conductive material is also applied as a layer 156 on the contact pads 55, 57, 58 on the upper surface 53 of the first laminate electronic component 51, contact pads 66 the upper surface 153 of the second laminate electronic component 52 and the contact pads 70, 72, 74, 74', 75 on the lower surface 71 of the first electronic component 51, as is illustrated in FIGS. 23*a* and 23*b*. The contact pads 70, 72, 74, 74', 75 on the lower surface 71 and the larger area contact pads 57, 58 on the upper surface 53 of the first electronic component 51 provide the outer contact pads for the assembly 50.

FIG. 24 illustrates an example of a power supply apparatus 160 in which the assembly 50 may be used.

The power supply apparatus 160 includes a control circuit 161 which receives a pulse width modulation input signal 162, a half-bridge circuit 163 including a low side transistor 164 coupled to a high side transistor 165 and an inductor 166. A source 167 of the low side transistor 164 is coupled to a ground terminal 168, a gate 169 of the low side transistor 164 is controlled by the control circuit 161 and a drain 170 of the low side transistor 164 is coupled to a source 171 of the high side transistor 165. A drain 172 of the high side transistor 165 is coupled to a Vin terminal 176 and a gate 173 is coupled to the control circuit 161. The inductor 166 is coupled between a node 174 between the drain 170 of the low side transistor 164 and the source 171 of the high side transistor 165 and a Vout terminal 175. The inductor 166 may also be grounded via a capacitor.

The control circuit 161 is used to turn on or turn off the low side transistor 164 and high side transistor 165. In particular, the control circuit 161 outputs control signals with reversed polarity to the gates 169, 173 of the high side transistor 165 and the low side transistor 164 thereby stepping down the input voltage Vin to the output voltage Vout.

The half-bridge circuit 163 may be provided by the first laminate electronic component 50 and the control circuit 161 may be provided by the second laminate electronic component of the assembly 50. The half-bridge circuit 163, control circuit 161 and the inductor 166 may be provided by the assembly 83 illustrated in FIG. 3b.

The distribution of the components of the voltage regular amongst the first and second laminate electronic component 51, 52 may differ from that illustrated in FIG. 24. For example, some of the control circuitry 161 may be embedded in the first laminate electronic component 51.

Clause 1. An assembly, comprising: a first laminate electronic component comprising a first dielectric layer, at least one first semiconductor die embedded in the first dielectric layer and at least one first contact pad comprising a first conductive via, and a second laminate electronic component comprising a second dielectric layer, at least one second semiconductor die embedded in the second dielectric layer and at least one second contact pad comprising a second conductive via, wherein the first conductive via is electrically coupled to the second conductive via by a common conductive layer.

Clause 2. The assembly according to clause 1, wherein the first semiconductor die is a transistor device.

Clause 3. The assembly according to clause 1 or clause 2, wherein the first laminate electronic component comprises two transistor devices configured to provide a half-bridge circuit.

Clause 4. The assembly according to one of preceding clauses, wherein the first laminate electronic component comprises at least two semiconductor dies configured to provide a switching circuit.

Clause 5. The assembly according to one of preceding clauses, wherein the second electronic component comprises at least one semiconductor die configured to provide at least one of a gate driver and control circuitry for the first laminate electronic component.

Clause 6. The assembly according to one of preceding clauses, wherein the first laminate electronic component and second laminate electronic component are configured to provide a voltage regulator.

Clause 7. The assembly according to one of preceding clauses, wherein the first laminate electronic component comprises a first contact pad and a second contact pad positioned on an upper side of the first laminate electronic component and the second laminate electronic component is arranged on the upper side of the first laminate electronic component and is accommodated between the first contact pad and the second contact pad.

Clause 8. The assembly according to one of preceding clauses, further comprising a discrete inductor arranged on the first contact pad and the second contact pad.

Clause 9. The assembly according to clause 8, wherein the discrete inductor comprises a first contact and a second contact having a thickness selected to accommodate a thickness of the second laminate electronic component.

Clause 10. The assembly according to clause 8, wherein the discrete inductor further comprises a recess between the first contact and the second contact of the discrete inductor and the second laminate electronic component is accommodated in the recess.

Clause 11. The assembly according to one of preceding clauses, wherein the first laminate electronic component further comprises a plurality of first signal contact pads Clause 12. The assembly according to one of preceding clauses, wherein the plurality of first signal contact pads is arranged in at least two opposing edge regions of the upper side and in at least two opposing edge regions of the lower side of the first laminate electronic component.

Clause 13. The assembly according to one of preceding clauses, wherein at least one of the plurality of first signal pads comprises a conductive via.

Clause 14. The assembly according to one of preceding clauses, wherein the second laminate electronic component further comprises a plurality of second signal contact pads.

Clause 15. The assembly according to clause 14, wherein the plurality of second signal pads is arranged in at least two opposing edge regions of the upper side and in at least two opposing edge regions of the lower side of the second laminate electronic component.

Clause 16. The assembly according to clause 15, wherein at least one of the plurality of second signal pads comprises a conductive via.

Clause 17. The assembly according to one of preceding clauses, wherein the first laminate electronic component further comprises at least one first contact pad comprising a first conductive via and the second laminate electronic component further comprises at least one second contact pad comprising a second conductive via, wherein the first conductive via is electrically coupled to the second conductive via by a common conductive layer.

Clause 18. The assembly according to one of preceding clauses, wherein the common conductive layer comprises one of the group consisting of a metal, an alloy and a conductive adhesive.

Clause 19. The assembly according to one of preceding clauses, wherein the second laminate electronic component is attached to the first laminate electronic component by an insulating adhesive.

Clause 20. The assembly according to one of preceding clauses, wherein the first contact pad comprises an area that is between 8% and 25% of the area of the upper surface of the first laminate electronic component.

Clause 21. The assembly according to one of preceding clauses, wherein he second contact pad comprises an area that is between 8% and 25% of the area of the upper surface of the first laminate electronic component.

Clause 22. The assembly according to one of preceding clauses, wherein the first contact pad comprises an area that is between 15% and 30% of the area of the upper surface of the second laminate electronic component.

Clause 23. The assembly according to one of preceding clauses, wherein the second contact pad comprises an area that is between 15% and 30% of the area of the upper surface of the second laminate electronic component.

Clause 24. The assembly according to one of preceding clauses, wherein at least one of the first contact pad and the second contact pad comprises between xx g and xx g of a metal or alloy.

Clause 25. A method, comprising mounting a second laminate electronic component comprising a second dielectric layer and at least one second semiconductor die embedded in the second dielectric layer on a first laminate electronic component comprising a first dielectric layer and at least one first semiconductor die embedded in the first dielectric layer, electrically coupling a contact pad of the second laminate electronic component with a contact pad of the first laminate electronic component by introducing conductive material into vias arranged in the contact pad of the second laminate electronic component and into a via in the contact pad of the first laminate electronic component.

Clause 26. The method according to clause 25, further comprising inserting at least one via in at least one contact pad of the second laminate electronic component and in at least one contact pad of the first laminate electronic component whilst the second laminate electronic component is arranged on the first laminate electronic component.

Clause 27. The method according to clause 26, wherein the contact pad of the second laminate electronic component is mounted on the contact pad of the first electronic component.

Clause 28. The method according to clause 27, wherein the via is inserted by at least one of drilling, laser ablation a via through a thickness of the second laminate electronic component and through a thickness of the first laminate electronic component.

Clause 29. The method according to one of clauses 25 to 29, wherein the conductive material is introduced by at least one of electroless plating and electroplating.

Clause 30. The method according to one of clauses 25 to 29, further comprising arranging a discrete inductor on a first contact pad and on a second contact pad positioned on an upper side of the first laminate electronic component and adjacent opposing sides of the second laminate electronic component.

Clause 31. The method according to one of clauses 25 to 30, wherein the second laminate electronic component is attached to the first laminate electronic component by a non-conductive adhesive.

Clause 32. A voltage regulator, comprising: a first laminate electronic component comprising a switching circuit comprising at least two switching devices and a first dielectric layer, wherein the at least two switching devices are embedded in the first dielectric layer and electrically coupled to an output contact pad arranged on a first side of the first laminate electronic component, a second laminate electronic component comprising a semiconductor die comprising circuitry for controlling the at least two switching devices and a second dielectric layer, wherein the semiconductor die is embedded in the second dielectric layer, wherein the second laminate electronic component is mounted on and electrically coupled to at least one signal contact pad arranged on the first side of the first laminate electronic component.

Clause 33. The voltage regulator according to clause 32, wherein the first laminate electronic component further comprises an input contact pad and a ground contact pad arranged on a second side of the dielectric layer.

Clause 34. The voltage regulator according to clause 32 or clause 33, wherein the first laminate electronic component further comprises a second output contact pad arranged on the first side of the dielectric layer.

Clause 35. The voltage regulator according to clause 34, wherein the first output contact pad and the second output contact pad are arranged on opposing sides of the second laminate electronic component.

Clause 36. The voltage regulator according to clause 35, further comprising a discrete inductor arranged on the first output contact pad and the second output contact pad.

Spatially relative terms such as "under," "below," "lower," "over," "upper" and the like are used for ease of description to explain the positioning of one element relative to a second element. These terms are intended to encompass different orientations of the device in addition to different orientations than those depicted in the figures.

Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An assembly, comprising:
a first laminate electronic component comprising a first dielectric layer, at least one first semiconductor die embedded in the first dielectric layer and at least one first contact pad comprising a first conductive via, and
a second laminate electronic component comprising a second dielectric layer, at least one second semiconductor die embedded in the second dielectric layer and at least one second contact pad comprising a second conductive via,
wherein the first conductive via is electrically coupled to the second conductive via by a common conductive layer,
wherein the first laminate electronic component further comprises a third contact pad and a fourth contact pad positioned on an upper side of the first laminate electronic component, and wherein the second laminate electronic component is arranged on the upper side of the first laminate electronic component and is disposed between the third contact pad and the fourth contact pad,
wherein a lower side of the first laminate electronic component that is opposite from the upper side comprises a plurality of contact pads, the contact pads being configured to electrically couple the assembly to a printed circuit board.

2. The assembly according to claim 1, wherein the first semiconductor die is a transistor device.

3. The assembly according to claim 1, wherein the first laminate electronic component comprises two transistor devices configured to provide a half-bridge circuit.

4. The assembly according to claim 1, wherein the first laminate electronic component comprises at least two semiconductor dies configured to provide a switching circuit.

5. The assembly according to claim 1, wherein the second electronic component comprises at least one semiconductor die configured to provide at least one of a gate driver and a control circuit for the first laminate electronic component.

6. The assembly according to claim 1, wherein the first laminate electronic component and second laminate electronic component are configured to provide a voltage regulator.

7. The assembly according to claim 1, further comprising a discrete inductor arranged on the third contact pad and the fourth contact pad.

8. The assembly according to claim 1, wherein the first via is arranged in one of a plurality of first signal pads arranged in at least two opposing edge regions of the upper side and in at least two opposing edge regions of the lower side of the first laminate electronic component.

9. The assembly according to claim 1, wherein the common conductive layer comprises one of the groups consisting of a metal, an alloy and a conductive adhesive.

10. The assembly according to claim 1, wherein the second laminate electronic component is attached to the first laminate electronic component by an insulating adhesive.

11. The assembly according to claim 1, wherein the third contact pad fourth contact pads are laterally separated from one another by a first lateral area of the upper side of the first laminate electronic component, and wherein the second laminate electronic component is completely contained within the first lateral area.

12. The assembly according to claim 1, wherein the second laminate electronic component is flush against the upper side of the first laminate electronic component.

13. The assembly according to claim 7, wherein the discrete inductor comprises a first contact and a second contact having a thickness selected to accommodate a thickness of the second laminate electronic component.

14. The assembly according to claim 7, wherein the discrete inductor further comprises a recess between the first contact and the second contact of the discrete inductor and the second laminate electronic component is accommodated in the recess.

15. The assembly according to claim 8, wherein the second via is arranged in one of a plurality of second signal pads arranged in at least two opposing edge regions of the upper side and in at least two opposing edge regions of the lower side of the second laminate electronic component.

16. An assembly, comprising:
a first laminate electronic component comprising a first dielectric layer, at least one first semiconductor die embedded in the first dielectric layer and at least one first contact pad comprising a first conductive via, and
a second laminate electronic component comprising a second dielectric layer, at least one second semiconductor die embedded in the second dielectric layer and at least one second contact pad comprising a second conductive via,
wherein the first conductive via is electrically coupled to the second conductive via by a common conductive layer,
wherein the first laminate electronic component further comprises a third contact pad and a fourth contact pad positioned on an upper side of the first laminate electronic component, and wherein the second laminate electronic component is arranged on the upper side of the first laminate electronic component and is disposed between the third contact pad and the fourth contact pad,
wherein the first conductive via extends through the first contact pad, and
wherein the second conductive via extends through the second contact pad, and
wherein the common conductive layer extends from the first contact pad to the second contact pad,
wherein a lower side of the first laminate electronic component that is opposite from the upper side comprises a plurality of contact pads, the contact pads being configured to electrically couple the assembly to a printed circuit board.

17. The assembly according to claim 16, wherein the common conductive layer is positioned within the first conductive via and within the second conductive via.

* * * * *

UNITED STATES PATENT AND TRADEMARK OFFICE
CERTIFICATE OF CORRECTION

PATENT NO. : 10,257,937 B2  
APPLICATION NO. : 14/324316  
DATED : April 9, 2019  
INVENTOR(S) : M. Standing et al.

Page 1 of 1

It is certified that error appears in the above-identified patent and that said Letters Patent is hereby corrected as shown below:

On the Title Page

Item [54], change "DEVICE FOR" to -- METHOD AND DEVICE FOR --

In the Claims

Column 21, Line 16 Claim 11, Line 2 change "pad forth" to -- pad and fourth --

Signed and Sealed this  
Twenty-fifth Day of June, 2019

Andrei Iancu  
*Director of the United States Patent and Trademark Office*